United States Patent

Karavakis et al.

[11] Patent Number: 5,966,587
[45] Date of Patent: Oct. 12, 1999

[54] METHODS OF MAKING SEMICONDUCTOR ASSEMBLIES WITH REINFORCED PERIPHERAL REGIONS

[75] Inventors: Konstantine Karavakis, Cupertino; Joseph Fjelstad, Sunnyvale, both of Calif.

[73] Assignee: Tessera, Inc., San Jose, Calif.

[21] Appl. No.: 09/020,613

[22] Filed: Feb. 9, 1998

Related U.S. Application Data

[62] Division of application No. 08/516,645, Aug. 18, 1995.

[51] Int. Cl.$^6$ .......................... G01R 31/26; H01L 21/66; H01L 21/44; H01L 21/48; H01L 21/50
[52] U.S. Cl. .............................. 438/15; 438/118; 438/127
[58] Field of Search ............................... 438/15, 127, 118

[56] References Cited

U.S. PATENT DOCUMENTS

| | | |
|---|---|---|
| 4,751,482 | 6/1988 | Fukuta et al. . |
| 5,148,265 | 9/1992 | Khandros et al. . |
| 5,183,711 | 2/1993 | Wada et al. . |
| 5,346,861 | 9/1994 | Khandros et al. . |
| 5,525,545 | 6/1996 | Grube et al. . |
| 5,627,405 | 5/1997 | Chillara . |
| 5,677,576 | 10/1997 | Akagawa . |

*Primary Examiner*—Richard Booth
*Assistant Examiner*—Josetta Jones
*Attorney, Agent, or Firm*—Lerner, David, Littenberg, Krumholz & Mentlik, LLP

[57] ABSTRACT

A method of forming a microelectronic assembly having an element with contacts on a front surface thereof, an interposer with a plurality of connecting terminals in a connecting terminal region and bonding terminals in a bonding terminal region electrically connected to the connecting terminals includes the steps of juxtaposing the interposer with the microelectronic element so that the connecting terminals and bonding terminals of the interposer face away from the front surface of the element and so that the bonding terminal region is adjacent to the contacts of the microelectronic element; and connecting at least some of the contacts with at least some of the bonding terminals by a plurality of flexible leads while supporting the bonding terminals against the vertical movement to facilitate the connection.

11 Claims, 7 Drawing Sheets

METHODS OF MAKING SEMICONDUCTOR ASSEMBLIES WITH REINFORCED PERIPHERAL REGIONS

This is a divisional of U.S. patent application Ser. No. 08/516,645 filed Aug. 18, 1995 the benefit of which is claimed under 35 U.S.C. §120.

FIELD OF THE INVENTION

The present invention generally relates to microelectronic assemblies, and more specifically it relates to arrangements facilitating connection between a microelectronic component such as a semiconductor chip and external circuit elements.

BACKGROUND OF THE INVENTION

Semiconductor chips or integrated circuits are typically used in combination with such elements as interposers and substrates facilitating connection between the chip itself and the external circuit elements. The entire circuit operation depends upon the connections between the chip, the interposer and the substrate.

Various attempts have been made to produce connections between the chip and the external elements satisfying the above discussed requirements. In this respect, U.S. Pat. No. 5,148,265, granted Sep. 15, 1992, the disclosure of which is hereby incorporated by reference, discloses an advanced method for providing the connection between a semiconductor chip and external circuit elements. According to certain embodiments discussed in this patent, a semiconductor chip is connected to a corresponding substrate through a dielectric interposer. The semiconductor chip has a plurality of peripheral contacts positioned in a peripheral area of a front surface thereof. The flat, flexible interposer is formed with a plurality of connecting terminals, each of which is connected to a bonding terminal adjacent the periphery of the interposer. The flexible interposer is supported by a compliant layer. The peripheral contacts of the semiconductor chip are connected to the terminals of the interposer by bonding a multiplicity of fine wires between the bonding terminals and the contacts of the chip.

During the wire bonding operation, when the downwardly directed forces are applied to the peripheral region of the interposer containing the bonding terminals this area of the interposer flexes downwardly. This impedes the bonding of the wires and the bonding terminals.

Thus, further improvement would be desirable.

SUMMARY OF THE INVENTION

One aspect of the invention provides a microelectronic assembly comprising an interposer including a top layer with oppositely facing first and second surfaces. The top layer includes a connecting terminal region and a bonding terminal region. The interposer has connecting terminals on the second surface in the connecting terminal region and has bonding terminals in the bonding terminal region. The assembly also includes a microelectronic element such as a semiconductor chip or other element having a front surface and having contacts on the front surface. The interposer top layer overlies the front surface with said second surface facing upwardly away from the chip and with said first surface facing downwardly toward the microelectronic element. The connecting terminals are movable relative to said microelectronic element in vertical directions, towards the microelectronic element, whereas the bonding terminals are supported against such vertical movement.

The top layer preferably is a thin, flexible layer, and the assembly preferably includes a compliant layer disposed between the top layer and the microelectronic element and movably supporting the connecting terminal region of the top layer. The assembly according to this aspect of the invention desirably also includes means for reinforcing the bonding terminal region of said top layer against vertical movement towards said microelectronic element. Subassemblies according to this aspect of the invention can be subjected to a bonding operation, such as a wire bonding operation, in which flexible conductors such as bonding wires are connected between the bonding terminals and the contacts on the chip. Because the bonding terminal region is reinforced, the bonding operation can be conducted efficiently. However, the finished assembly still provides the benefits associated with a compliantly mounted interposer, including testability and compensation for thermal effects during service.

Alternatively, the interposer top layer bearing the connecting and bonding terminals may or may not include a rigid portion in the binding terminal region and a more flexible portion in the connecting terminal region. Here again, the top layer may be supported by a compliant layer between the top layer and the microelectronic element. In this arrangement, the rigid top layer spreads loads applied to individual bonding terminals over a large area of the compliant layer, and thus reinforces each bonding terminal against downward movement during the connecting step.

According to a further aspect of the invention, a semiconductor chip assembly is provided having a semiconductor chip with a front surface defining the top of the chip. The front surface includes a peripheral region. A plurality of peripheral contacts of the chip are disposed in the peripheral region of the front surface. A generally planar interposer overlies the front surface of the chip, the interposer having a first surface facing towards the chip and a second surface facing away from the chip. A peripheral region of the interposer is disposed adjacent the edges thereof. A plurality of connecting terminals are disposed on the interposer. The connecting terminals face away from the chip and are exposed at the second surface of the interposer for connection to another component such as a substrate. Each connecting terminal is electrically connected to a bonding terminal situated in the peripheral region of the interposer, on the second surface thereof. At least some of the peripheral contacts and at least some of the bonding terminals are connected by movable peripheral contact leads. A support structure reinforces the peripheral region of the interposer facilitating connection between the peripheral contact leads and the central terminals. The support structure may be in the form of a ring encircling an interior area which may be substantially empty. The peripheral region of the interposer and the bonding terminals are reinforced by the support structure.

A central part of the interposer corresponding to the interior area of the support structure preferably is movable in a vertical direction to permit vertical movement of the connecting terminals relative to the chip. Thus, the interior area within the support structure underlying the central region of the interposer may contain a layer of a compliant material such as a gel or elastomer, which supports the central region of the interposer. As further discussed herein, such movability facilitates connection and testing of the assembly. The support structure can be independent from the interposer or can form a part of the interposer.

The support structure may project vertically from the first surface of the interposer in the peripheral region thereof. A plurality of grooves can be provided extending horizontally across the support structure. Such grooves desirably connect the interior area with an area outside the support structure. As discussed herein, these grooves facilitate introduction of the compliant material to the interior area.

A still further aspect of the present invention provides a method of forming a microelectronic assembly such as a semiconductor chip assembly consisting of an element having a front surface thereof and an interposer having connecting terminals in a connecting terminal region and bonding terminals in a bonding terminal region. The method includes the step of placing the interposer on the element so that the connecting terminals and the bonding terminals of the interposer face away from the front surface of the element. The method further includes the step of connecting at least some of the contacts on the element with at least some of the bonding terminals by attaching flexible leads such as bonding wires, while supporting at least the bonding terminal region of the interposer and the bonding terminals in the vertical direction to facilitate the connection.

The method may further include the step of testing, wherein the semiconductor assembly is tested by a testing arrangement having a plurality of probes, so that during this step the terminals of the interposer engage the probes of the testing structure. The testing structure may be a special test fixture, or may be the substrate to which the assembly will be permanently mounted. The engagement between the connecting terminals of the interposer and the probes of the testing arrangement is facilitated by flexibility of the connecting terminal region of the interposer in the vertical direction. That flexibility is not impaired by the support provided to the bonding terminal region.

BRIEF DESCRIPTION OF THE DRAWINGS

Other advantages and features of the invention described are illustrated in the drawings which.

DETAILED DESCRIPTION OF THE PREFERRED EMBODIMENTS

Figure 1:
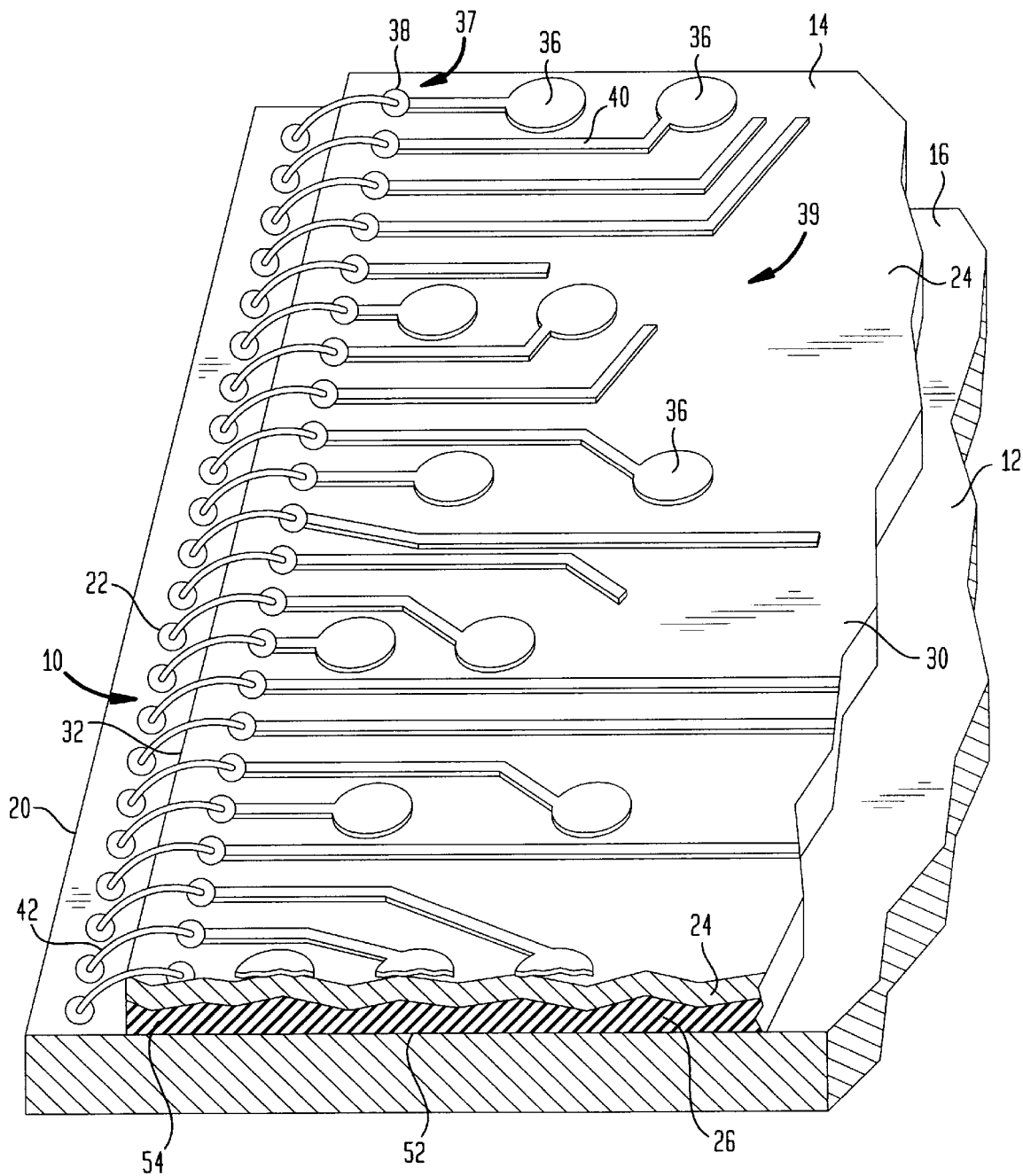
FIG. 1 is a fragmentary perspective view showing portions of a semiconductor chip assembly in accordance with one embodiment of the invention.

Although specific embodiments of the invention will now be described with reference to the drawings, it should be understood that the embodiments shown are by way of examples only and merely illustrative of but few of many possible specific embodiments which represent application of the principles of the invention. Various changes and modifications obvious to one skilled in the art to which the invention pertains are deemed to be within the spirit, scope and contemplation of the invention as further defined in the appended claims.

A semiconductor chip assembly 10, according to an embodiment of the present invention is best illustrated in FIGS. 1–4 and includes a semiconductor chip 12 and interposer 14. The semiconductor chip 12 has front surface 16 and rear surfaces 18. The front surface defines a top of the chip and includes a peripheral region 20. A plurality of peripheral contacts 22 are disposed in the peripheral region of the front surface of the chip. These contacts are connected to the internal circuitry of the chip (not shown).

A sheetlike dielectric interposer 14 is connected to the chip 12. The interposer includes a flexible top layer 24 formed by a thin sheet of material having relatively high elastic modules and a compliant bottom layer 26 formed from a material having a relatively low elastic modules. The high modules material of the top layer 24 may be a polymer such as polyimide or another thermoset polymer. The compliant, low modulus material of the bottom layer 26 may be an elastomer or gel. Generally, the low-modulus material of the bottom layer should have a modulus of elasticity comparable to that of soft rubber.

The interposer overlies the front surface 16 of the chip and has a first surface 28 facing toward the chip and a second surface 30 facing away from the chip. The interposer is generally rectangular, and has four outward edges defining its periphery, one such edge 32 being visible in FIG. 1. A plurality of connecting terminals 36 are provided on the second surface 30 of the interposer for connection to a substrate (not shown). Connecting terminals 36 face away from the chip. Each connecting terminal has a bonding terminal 38 provided in a peripheral region 37 of the interposer, adjacent the edges such as edge 32. The bonding terminals 38 are arranged in intervals adjacent to the outward edges of the interposer. A lead 40 connects each connecting terminal 36 with the bonding terminal. Connecting terminals 36 are typically distributed over the second or top surface 30 of the interposer and can be disposed at substantially even spaces within a central region 39 of the interposer, remote from the edges. Compliant bottom layer 26 is disposed beneath the central region 39, and beneath connecting terminals 36. The leads 40 and bonding terminals 38 may be formed from virtually any electrically conductive material. However, these components preferably are formed from metallic materials such as copper or copper alloys. These components are usually prefabricated on the top or second surface of the interposer by conventional methods.

Figure 5:
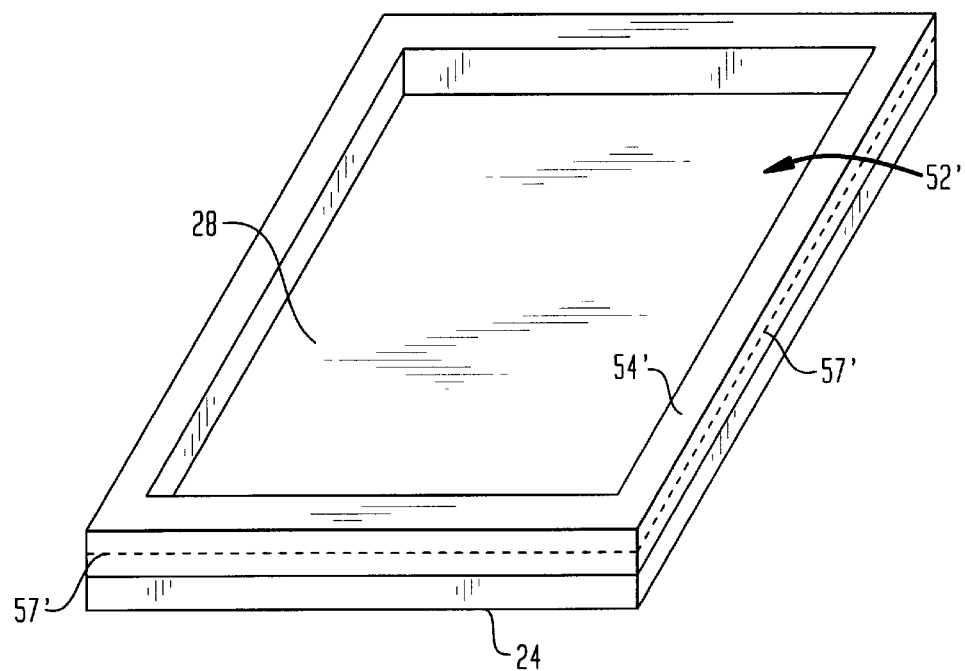
FIGS. 4, 5 and 6 are perspective views showing support structures in accordance with further embodiments of the invention.

A support structure 50 is provided between the front surface 16 of the chip and the first surface 28 of the interposer. The support structure, illustrated in inverted view FIG. 5 includes a generally rectangular ring-like exterior portion 54 surrounding interior area 52. The exterior portion of the support structure desirably is formed from a rigid material such as a ceramic or a metal. The thickness or vertical dimension of the support structure, perpendicular to the plane of the ring, may be approximately equal to the thickness of compliant layer 26. The ringlike exterior portion 54 of the support structure 50 is aligned with the peripheral region 37 of the interposer which accommodates the bonding terminals 38 of the terminal assemblies. The support structure typically does not extend beyond the outward edges 32 of the interposer. The interior area 52 encircled by the support structure is aligned with the central region 39 of the interposer receiving the terminals 36. As best seen in FIG. 1, the compliant layer 26 occupies the interior area 52.

The exterior portion of the support structure 54 projects vertically downwardly from the first surface 28 of the interposer and abuts both the interposer top layer 24 and the chip front surface 16.

Figure 2:
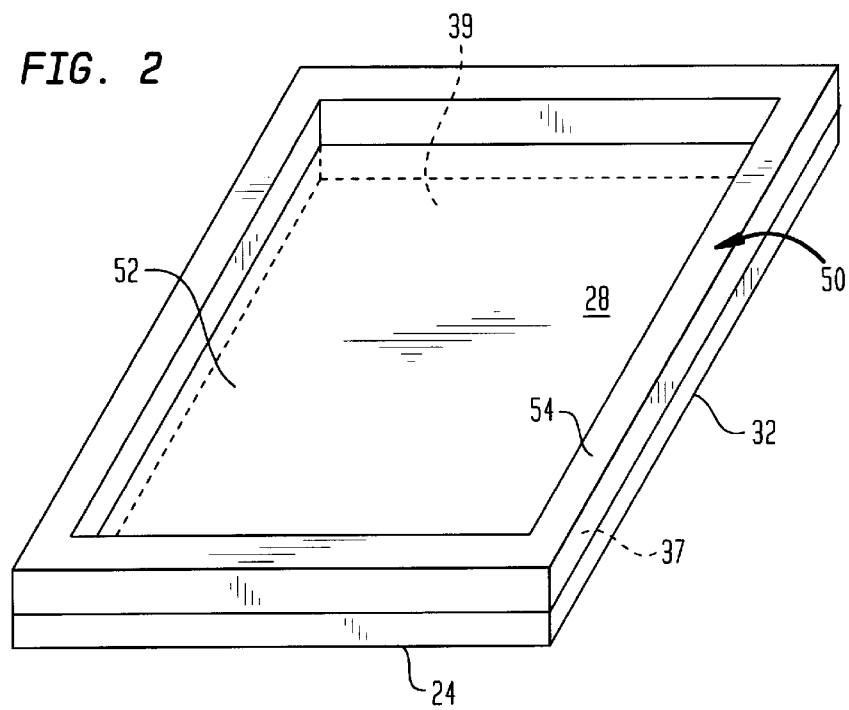
FIG. 2 is an inverted, perspective view of the interposer and support structure used in the assembly of FIG. 1.
Figure 3:
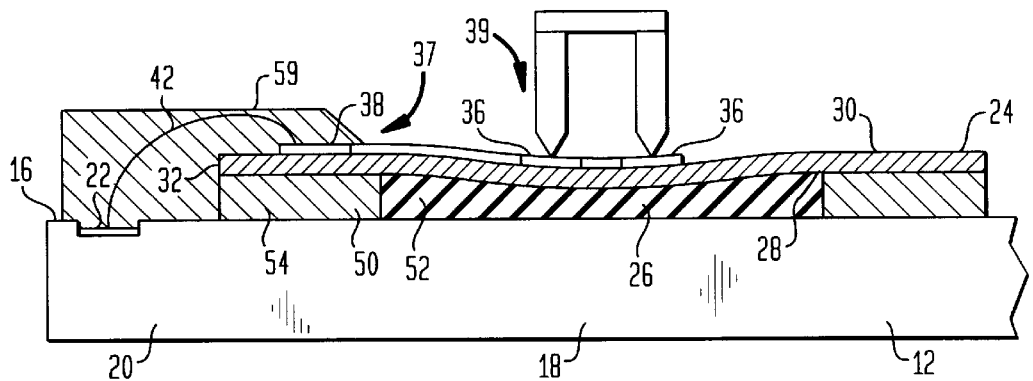
FIG. 3 is a side elevational view showing the semiconductor chip assembly of FIG. 1 with a testing arrangement.

In an assembly process according to an embodiment of the invention, the interposer and support structure are positioned on the chip as illustrated in FIGS. 1–3 and as described above. Support structure may be mounted to the first surface 28 of the interposer top layer 24 and a preformed, soft, compliant layer 26 may be placed into the interior area 52 defined by the support structure. Alternatively, the interposer may be formed with compliant layer 26 in place on first surface 28, and the support structure may be placed around the compliant layer. The resulting subassembly may then be positioned on the front surface 12 of chip 10. In another variant of the process, the support structure, the compliant layer or both may be positioned on the chip surface and the top layer may be assembled thereto. The compliant layer, the top layer and the support structure optionally may be bonded to one another or to the chip using adhesives to facilitate handling during assembly. If the support structure is bonded to the chip, its coefficient of thermal expansion should match that of the chip. However, the support structure is bonded to the top layer, its coefficient of thermal expansion desirably is close to that of the top layer.

After the interposer and support structure have been assembled, bonding terminals 38 are connected to the peripheral contacts of the chip by securing short, flexible lead sections 42 between each bonding terminal and peripheral contact. Lead sections 42 may be short pieces of gold or other metallic wire, and may be applied by known wire bonding equipment. Such equipment typically includes a bonding tool with a wire feed hole therein. A continuous wire is introduced through the hole. The tool is forcibly engaged with a bonding terminal 38 and heat, vibration or both is applied to bond the wire to the bonding terminal. After such bonding, the tool is withdrawn and moved to the peripheral contact 22 while feeding out wire through the hole in the tool. The tool is then forcibly engaged with the peripheral contact, again with application of heat, vibration or both, to bond the wire to the peripheral contact. Following this, the tool is withdrawn from the peripheral contact, the wire is severed, typically by melting or "flaming off", and the cycle of operations is repeated on the next bonding terminal and contact. Of course, the cycle can be reversed so as to bond the wire to the contact on the chip first.

During the bonding operation, the exterior region 54 of support structure 50 reinforces the peripheral region 37 of the interposer top layer. The bottom surface of the support structure bears on the chip front surface 12, whereas the top surface of the support structure bears on the first surface 28 of the top layer. The support structure thus prevents downward motion of the peripheral region and prevents the bonding contacts 38 from moving downwardly when the bonding tool is engaged with the bonding contacts. Thus, the engagement between the bonding tool and the bonding contacts can be controlled readily, to provide a rapid, secure bonding process. The assembly can then be encapsulated by applying a curable compliant encapsulate 59 (FIG. 3) over the bonding wires 42, bonding terminals 38 and chip contacts 22, while leaving the connecting terminals exposed.

As seen in FIGS. 2 and 3, the resulting assembly can be tested by engaging it with a test fixture 70 having a plurality of contacts 72, so that the contacts on the test fixture engage the connecting terminals 36. As described in greater detail in the aforementioned '265 patent, the compliant layer and the flexible top layer allow the connecting terminals to move vertically as required relative to one another and relative to the chip. This facilitates reliable engagement with the test fixture even where the contacts 72 or the connecting terminals are not precisely coplanar. Signals and power can be applied to the assembly through the test fixture. After testing, the assembly is bonded to a substrate such as a circuit panel (not shown), so that each connecting terminal 36 is bonded to a contact pad on the substrate using solder or other suitable bonding material. In a variant of this process, the test fixture may be the substrate itself. Thus, the assembly may be engaged with the substrate under pressure and tested by signals applied though the substrate. If the test is satisfactory, the bonding material can be activated to form a permanent bond. As shown in FIG. 3, the support structure is aligned only with the peripheral region 37 bearing the bonding terminals. The support structure is remote from the central region 39 bearing the connecting terminals, and therefore does not interfere with movement of the connecting terminals.

As also described in the '265 patent, the flexibility of the interposer top layer and leads, as well as the compliance and flexibility of the bottom layer, permit each connecting terminal 36 to move relative to the contact 22 on the chip, both in vertical directions perpendicular to the chip front surface and in horizontal directions parallel to the chip front surface. This compensates for differential thermal expansion of the chip and substrate. Here again, the support structure does not interfere with the compensating action of the other elements in the structure.

Figure 4:
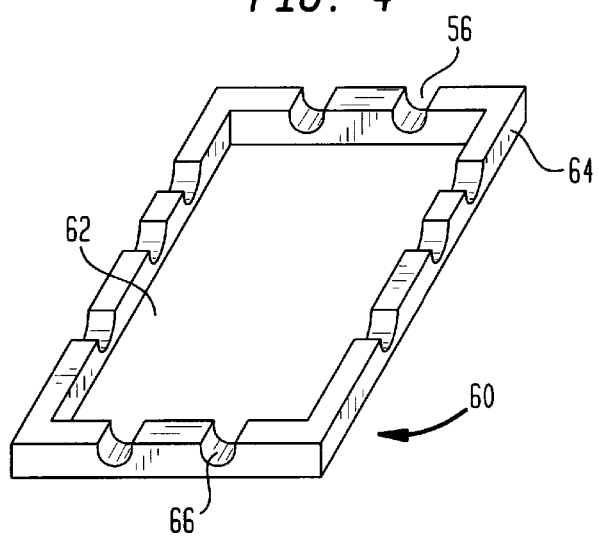

In another embodiment of the process, the compliant layer is formed in position on the chip surface, by introducing a curable liquid elastomer or gel into the interior area defined by the support structure and then curing the liquid to form the compliant layer. In this arrangement, the compliant layer may be formed after the wire bonding step, and may be formed simultaneously with the encapsulant. Thus, during the wire bonding step, the top layer of the interposer is supported above the chip front surface only by the support structure. A support structure as illustrated in FIG. 4 may be used in this arrangement. The support structure 60 includes a rigid, ringlike exterior portion 64 similar to the exterior portion of the support structure discussed above. However, exterior portion 64 has grooves or interruptions 66 extending in horizontal directions from the interior area 62 to the outside of the support structure at spaced-apart locations around the periphery of the support structure. These interruptions allow the curable liquid material to penetrate into interior area, between the chip and the top layer of the interposer. The interruptions also allow air or other trapped gasses to escape from the interior area.

Figure 6:
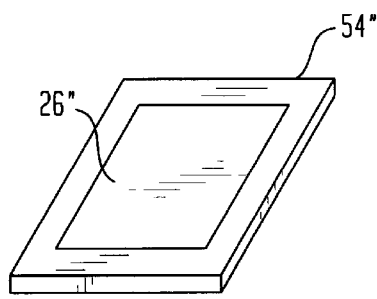

In a further embodiment, the support structure 54' (FIG. 5) may be formed integrally with the top layer 24', and may project vertically downwardly from the first surface 28' of the top layer, in alignment with the peripheral region of the top layer and in alignment with the bonding contacts. Thus, the support structure is formed as a thicker region of the top layer. This region may incorporate fibrous or other reinforcements 57' to increase the rigidity of the support structure, and may also include grooves or other interruptions as discussed above with reference to FIG. 4. In yet another embodiment, the support structure 54' (FIG. 6) can be formed integrally with the compliant layer 26', or bonded to the compliant layer to form a subassembly, with the relatively rigid support structure extending alongside of the compliant layer. Such a structure can be formed, for example, by dual-component injection molding using a soft resin to form the compliant layer and a hard resin to form the support structure, or by casting the compliant material inside the support structure.

Figure 7:
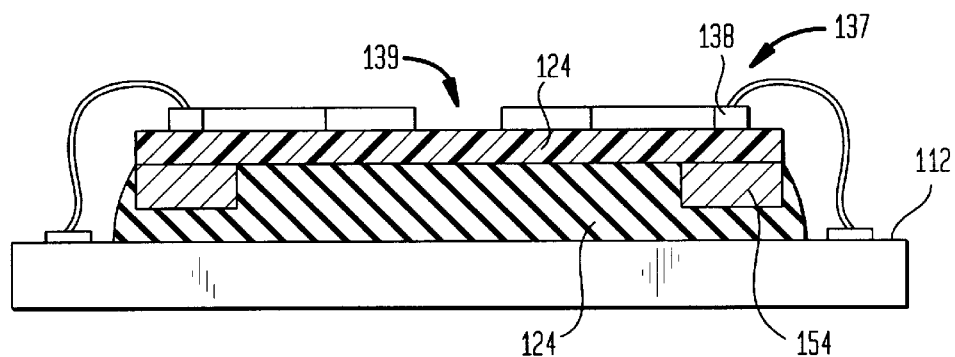
FIG. 7 is a side elevational view of another embodiment of the semiconductor chip assembly of the invention.

In the embodiment of FIG. 7, the support structure 154 does not abut the chip front surface 112. A portion of the compliant layer 124 extends between the chip front surface and the support structure. Nonetheless, the support structure reinforces and stiffens the top layer 124 in the peripheral or bonding-terminal region 137. Thus, when downward forces are applied to a particular bonding terminal 138, the support structure will spread these forces over a large region of the compliant layer. The support structure may be integral with the top layer or formed separately. To provide an integral support structure, the peripheral or bonding-terminal region of the top layer can be formed from a different material, or with a greater thickness, than the central or connection-terminal region 139.

According to the embodiments discussed above the exterior area of the support structure is formed flush with the outer edges of the interposer. However, the exterior area of the interposer could be slightly inwardly recessed from the outward edges, as long as it provides the required support for the rows of the bonding terminals, or could project outwardly beyond the interposer.

Figure 8:
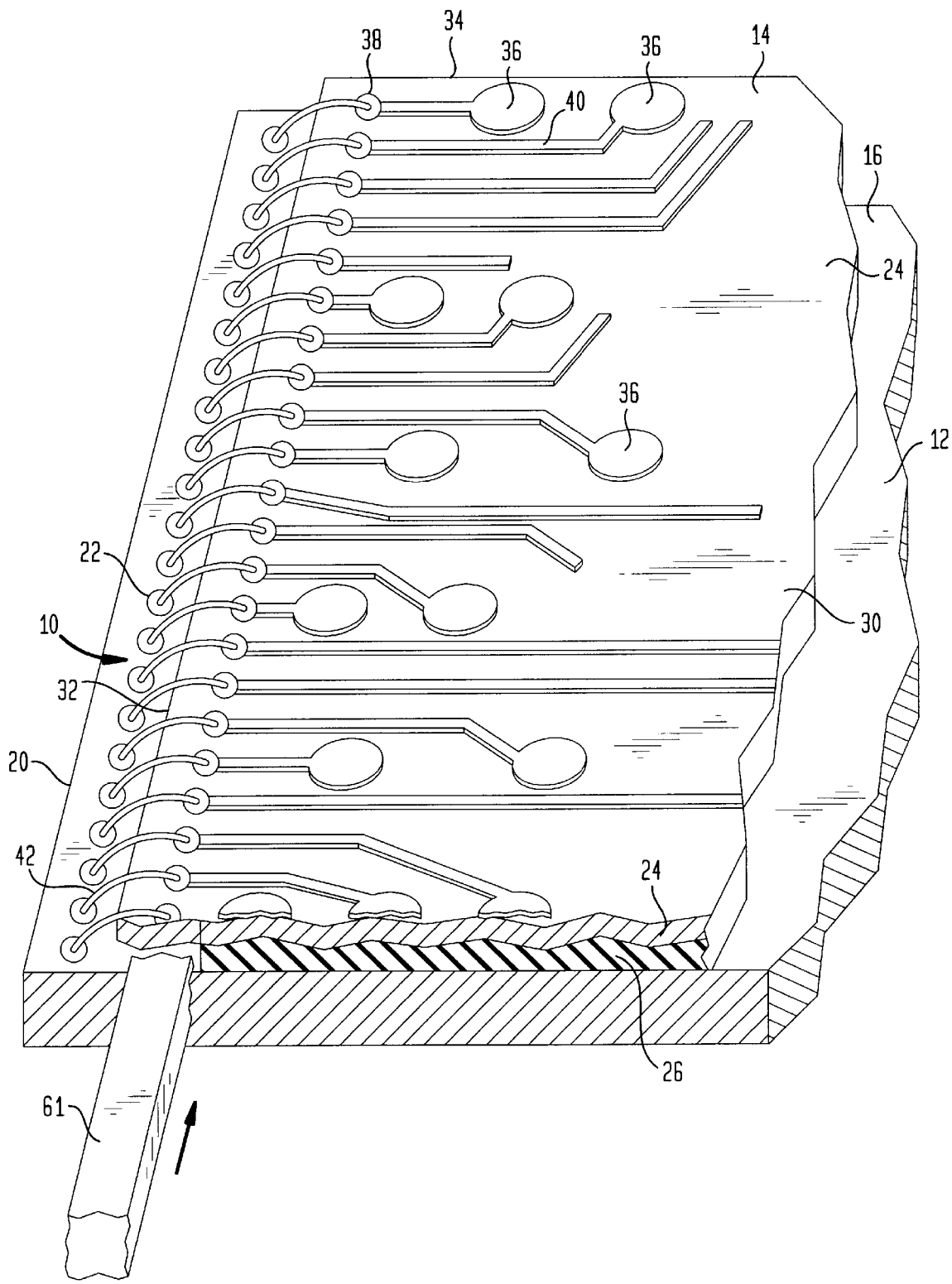
FIG. 8 a perspective view of a further embodiment of the invention.

In another embodiment of the invention illustrated in FIG. 8, support for the peripheral region of the interposer accommodating the bonding terminals can be provided during the bonding step by a special tool having a support structure 261. This support structure can be inserted in a space between the interposer top layer and the front surface 216 of the chip by moving the tool in the direction parallel to the row of the bonding terminals 236. The support structure 261 is only temporarily positioned between the interposer and the chip, so as to provide support for the peripheral region and the bonding terminals of the interposer during the bonding operation. Upon completion of this step, the support structure 261 is withdrawn from the assembly by movement in the opposite direction.

Figure 9:
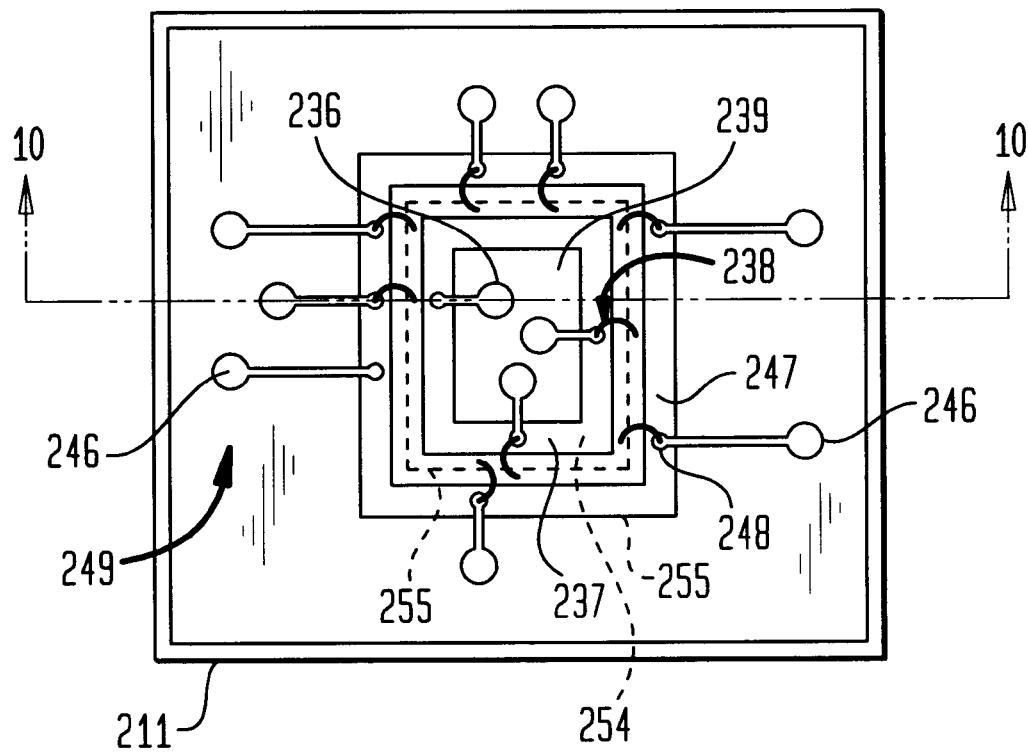
FIG. 9 is a plan view depicting an assembly according to a further embodiment.
Figure 10:
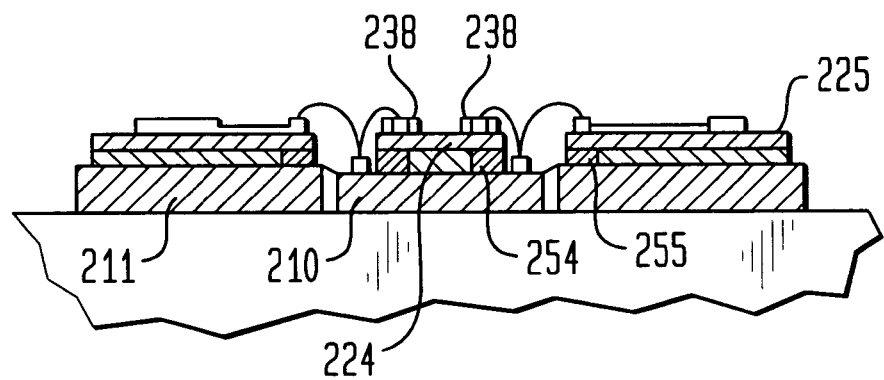
FIG. 10 is a sectional view along line 10—10 in FIG. 9.

A further embodiment incorporates a first interposer similar to those discussed above, having bonding terminals 238 (FIG. 9) disposed in a peripheral region 237 adjacent the outer edges of the interposer top layer 224, and connecting terminals 236 disposed in a central region 239. As in the embodiments discussed above, the first interposer is disposed within the area bounded by the rows of contacts 222 on the semiconductor chip 210. The bonding terminal region is again reinforced by a support element 254 disposed between the interposer top layer and the chip. Chip 210 is nested within a ring-like package element 211, so that the chip and package element cooperatively constitute a composite microelectronic element. A second interposer overlies the package element 211. The second interposer has a top layer 225 in the form of a rectangular ring, and has bonding terminals 248 in a bonding terminal region 247 adjacent the inner edges of the ring. The second interposer has connecting terminals 246 disposed in a connecting terminal region 249 surrounding the bonding terminal region. Here again, the connecting terminals are electrically connected to the bonding terminals. However, the connecting terminals are peripheral whereas the bond terminals are central. The bonding terminal region 247 of the second interposer is supported and reinforced by a support element 255 disposed between the bonding terminal region of the top layer 225 and the package element 211. In this embodiment as well, the connecting terminal region of each interposer—region 239 of the first interposer and region 249 of the second interposer—is movably supported above the front face of the composite microelectronic element, whereas the bonding terminal region is firmly supported and reinforced. The first interposer has a "fan-in" configuration, with connecting terminals 236 disposed inwardly of the contacts 222 on the chip, whereas the second interposer has a "fan-out" configuration, in which the connecting terminals 246 are disposed outwardly of the chip contacts. To provide a fan-out only structure, the first interposer may be omitted and all of the chip contacts may be connected to the second interposer.

The same principles can be applied in other configurations. For example, the bonding terminals may be disposed in rows alternating with rows of connecting terminals, so that strip-like bonding terminal regions are disposed in alternating arrangement with strip-like connecting terminal regions. The interposer top layer may be provided with slots or holes adjacent each bonding terminal region to provide access to the chip surface for wire bonding. In this arrangement as well, the bonding terminal regions may be reinforced by support structures to facilitate the bonding operations, whereas the connecting terminal regions of the interposer top layer desirably are flexible and resiliently supported above the microelectronic element by the compliant layer, to facilitate testing and engagement of the connecting terminals with the substrate. Still other configurations may have bonding terminals disposed in clusters, with each cluster constituting a bonding terminal region and each such bonding terminal region having a supporting structure.

In an alternative arrangement, the entire interposer top layer, including both the bonding terminal regions and the connecting terminal regions can be substantially rigid, but supported above the microelectronic element by a compliant layer. In such an arrangement, the support structure may be incorporated into the interposer top layer or laminated thereto, and may extend over the entire interposer, including the connecting terminal regions. This arrangement facilitates wire bonding, but sacrifices some functions associated with the flexible top layer as discussed above. Thus, the top layer cannot deform to bring the connecting terminals into engagement with mating contacts during testing or assembly to the substrate. However, the compliant layer allows the top layer to tilt as a whole to provide some compensation for misalignment. Because the compliant layer decouples the microelectronic element or chip from the interposer top layer, differences in thermal expansion between the microelectronic element and the top layer can be accommodated to some degree. However, differences in expansion between the top layer and the substrate, or warpage of either the top layer or the substrate, will induce stresses in the connections between the substrate and the wire bonds. Therefore, in this embodiment the top layer should have a coefficient of thermal expansion close to that of the substrate.

Figure 11:
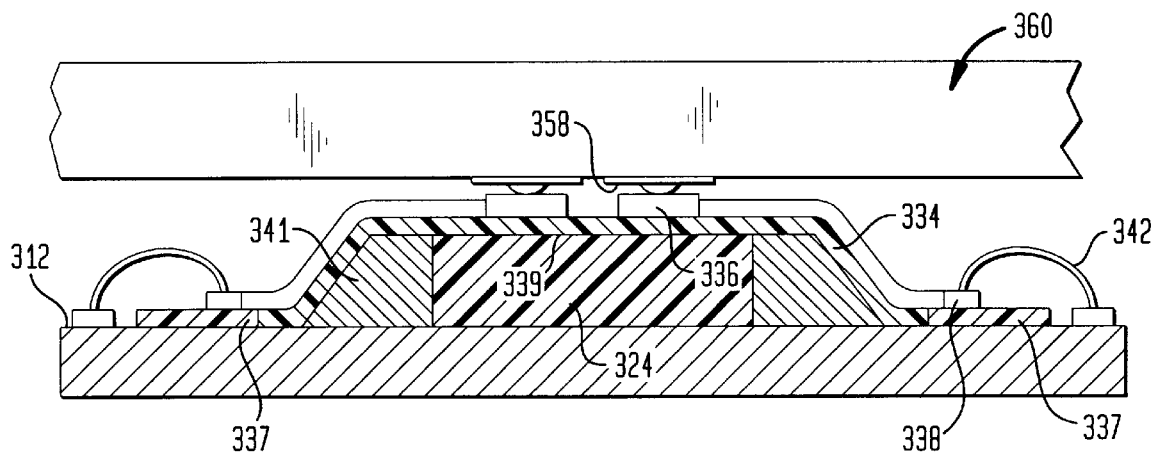
FIG. 11 is a sectional view of an assembly according to a further embodiment.

Moreover, the interposer may include nonplanar features such as a step or ridge. In the embodiment of FIG. 11, the interposer top layer 334 includes peripheral bonding terminal regions 337 bearing bonding terminals 338, and includes a central connecting terminal region 339 bearing connecting terminals 336 electrically connected to the bonding terminals by flexible leads extending along the top layer. The central portion is resiliently supported above the chip front surface 312 by a compliant layer 324, whereas the bonding terminal portion 337 directly overlies the chip front surface. Thus, the bonding terminal regions 337 are reinforced by the chip itself against vertical movement, and have essentially infinite vertical rigidity, whereas the connecting terminal region 339 is vertically compliant. A shaping element 341 is provided to give the top layer a gradual, sloping transition between the elevated connecting terminal region and the bonding terminal region. The elevated connecting terminal region and the recessed bonding terminal region provide enhanced clearance for the bonding wires. Thus, when contact pads 358 on a substrate 360 are connected to the connecting terminals 336, the substrate is spaced vertically from the bonding terminal region and from the bonding wires 342.

The bonding wires utilized in the embodiments discussed above may be replaced by other leads, such as separately formed metallic strips or metallic strips positioned on a separate carrier film, similar to a TAB (tape automated bonding) tape. In these embodiments as well, the reinforcement provided to the bonding terminal region facilitates the bonding operation.

Figure 12:
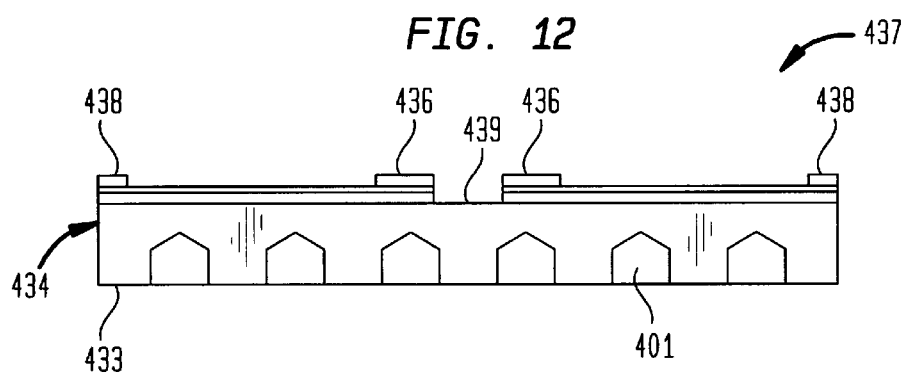
FIGS. 12, 13 and 14 are sectional views of components according to a further embodiment of the invention.

An interposer 434 according to a further embodiment of the invention (FIG. 12) includes a relatively thick layer top 433 of a material having a relatively high elastic modulus such as a fiber-reinforced polymer of the type commonly used as a printed circuit board. For example, a fiber reinforced polyimide material may be employed. Connecting terminals 436, are disposed in a central connecting terminal region 439, whereas bonding terminals 438 are disposed in bonding terminal regions 437 adjacent the edges of layer 433. As in the other embodiments discussed above, the bonding terminals are attached to the connecting terminals by leads extending therebetween. Layer 433 is provided with blind holes 401 extending upwardly from the bottom surface of the layer to a control depth, so that each hole terminates at a preselected distance beneath the top or terminal bearing surface of the layer. Holes 401 are distributed within and around the connecting terminal regional 439, whereas the bonding terminal regions are not provided with the holes. Thus, layer 433 is substantially rigid in the area underlying the bonding terminal regions 437 but has substantial flexibility in the connecting terminal region 439. Holes 401 may be fabricated by drilling a preexisting piece of circuit panel stock, or may be molded into the layer during its formation.

Figure 13:
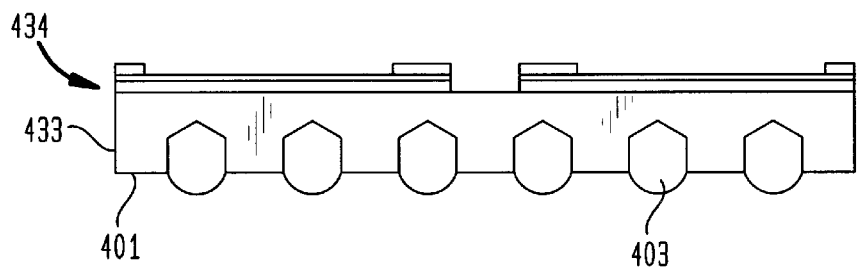
Figure 14:
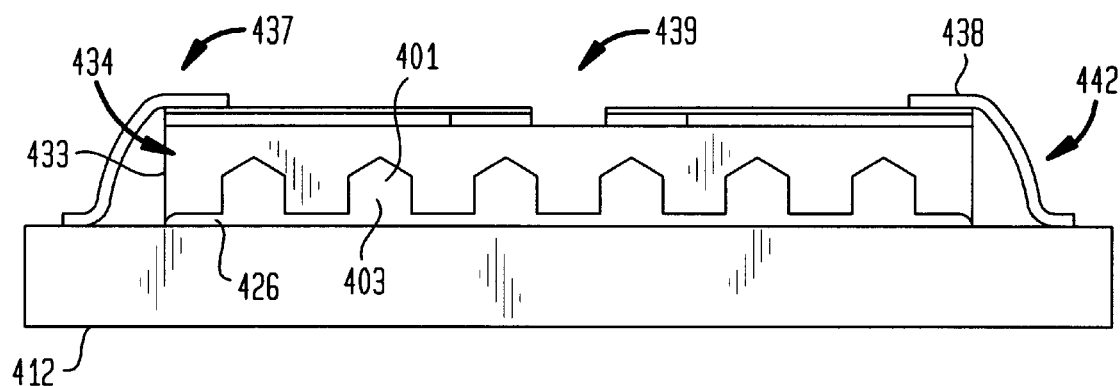
Figure 15:
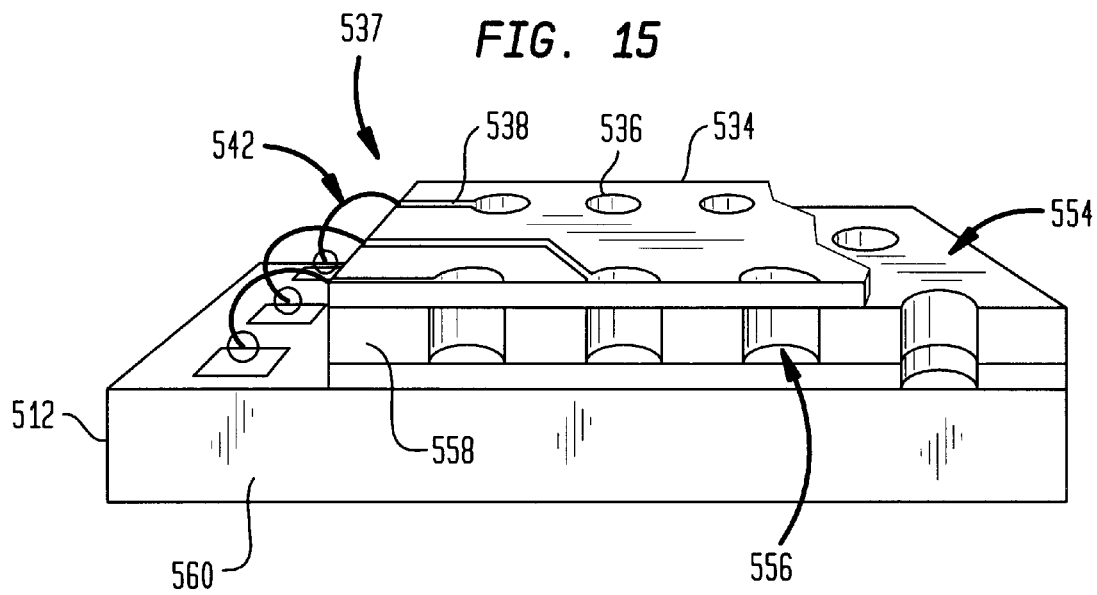
FIG. 15 is a partially sectional, perspective view depicting components according to yet another embodiment of the invention.

As shown in FIG. 13, holes 401 may be filled with a compliant material such as a gel or elastomer 403 before the layer is united with the microelectronic element or chip 412 (FIG. 14). When the interposer 434 is united with the chip, excess compliant material 403 forms a continuous compliant layer 426 underlying the entire interposer, including the bonding terminal regions 437 and the connecting terminal region 439. The relatively rigid portion of layer 433 acts as a support structure and reinforces the bonding terminal region 437. Leads 442 are connected between each bonding terminal 438 and the corresponding contact on chip 412. Here again, the bonding terminals are reinforced against downward movement by the relatively rigid structure underlying them, whereas the connecting terminals can move in vertical directions, towards the chip.

An assembly according to yet another embodiment of the invention includes an interposer top layer 534 with connecting terminals 536 and bonding terminals 538. The bonding terminals are disposed in bonding terminal region 537. Top layer 534 is thin and flexible, similar to the top layers discussed above. A reinforcing layer 554 is disposed beneath top layer 534, and an elastomeric adhesive layer 556 is disposed beneath the reinforcing layer. Reinforcing layer 554 is formed from a rigid material such as ceramic or a metal. Reinforcing layer 554 incorporates a solid region 558 underlying bonding terminal region 537. This solid region of the reinforcing layer reinforces the bonding terminals against vertical movement during the bonding operation as discussed above. The reinforcing layer 554 includes holes 560 aligned with the connecting terminals 536. Thus, because the top layer 534 is thin and flexible, each connecting terminal 536 can be moved downwardly towards chip 512 when a vertical load is applied to the connecting terminal. Such downward movement is accommodated by bending of the top layer downwardly into the holes 560. Thus, although the rigid reinforcing layer 554 extends beneath the entire top layer 534, it does not substantially reinforce the connecting terminals against vertical movement, so that the connecting terminals can still provide effective compensation for non-planarity and vertical movement during testing, assembly and use. Here again, the rigid solid portion 558 provides effective reinforcement for the bonding terminals 538 and facilitates application of bonding wires 542 between the bonding terminals and the chip contacts. The elastomeric adhesive layer 556 disposed between the relatively rigid reinforcement layer 554 and the chip allows for differential terminal expansion of the chip and the reinforcing layer. Thus, the elastomeric adhesive can deform in shear and allow relative movement of the confronting surfaces of these two rigid elements. The elastomeric adhesive thus decouples the reinforcing layer from the chip at least in the horizontal or chip-surface directions.

In a further variant, holes 560 can be filled with the elastomeric material. Conversely, the holes 401 of the arrangement illustrated in FIGS. 12–14 can be left empty.

As these and other variations and combinations of the features discussed above can be utilized without departing from the present invention as defined by the claims, the foregoing description should be taken by way of illustration rather than by way of limitation of the invention defined in the claims.

What is claimed is:

1. A method of forming a microelectronic assembly including an element having contacts on a front surface thereof, and an interposer having a plurality of connecting terminals in a connecting terminal region, and bonding terminals in a bonding terminal region electrically connected to said connecting terminals, said method comprising the steps of:

juxtaposing the interposer with the microelectronic element so that said connecting terminals and bonding terminals of the interposer face away from the front surface of the element; and so that said bonding terminal region is adjacent to said contacts of the microelectronic element; and connecting at least some of said contacts with at least some of said bonding terminals by a plurality of flexible leads, while supporting said bonding terminals against vertical movement towards said front surface of said element to facilitate said connection.

2. The method of claim 1, further comprising the step of testing the assembly is tested by engagement with a testing arrangement having a plurality of contacts, so that said connecting terminals of the interposer substantially engage said contacts of the testing structure, a connecting terminal region of the interposer being flexible and movable in vertical directions toward said microelectronic element, engagement between said connecting terminals of the interposer and said contacts of the testing arrangement being facilitated by flexibility of said interposer in said vertical direction.

3. The method of claim 1, wherein in said connecting step said interposer is supported by a support structure provided between said chip and said interposer, said support structure remaining between said interposer and said element after said connecting step.

4. The method of claim 3, wherein said support structure is independent from said interposer.

5. The method of claim 3, wherein said support structure contacts said chip.

6. The method of claim 3, wherein a space is provided between said support structure and said chip.

7. The method of claim 3, further comprising the steps of providing a liquid between said chip and said interposer, and curing said liquid to form a compliant layer, said support structure holding said interposer above said liquid during said curing step.

8. A method of forming a microelectronic assembly including an element having contacts on a front surface thereof, and an interposer having a plurality of connecting terminals in a connecting terminal region, and bonding terminals in a bonding terminal region electrically connected to said connecting terminals, said method comprising the steps of:

juxtaposing the interposer with the microelectronic element so that said connecting terminals and bonding terminals of the interposer face away from the front surface of the element; and so that said bonding terminal region is adjacent to said contacts of the microelectronic element; and connecting at least some of said contacts with at least some of said bonding terminals by a plurality of flexible leads, while supporting said bonding terminals against vertical movement to facilitate said connection, wherein said interposer includes a rigid top layer extending throughout said contact terminal region and said bonding terminal region, and a compliant layer is disposed between said rigid top layer and said front surface of said element prior to said step of connecting said contacts, said rigid top layer and said compliant layer cooperatively supporting said bonding terminals during said connecting step.

9. A method of forming a microelectronic assembly including an element having contacts on a front surface thereof, and an interposer having a plurality of connecting terminals in a connecting terminal region, and bonding terminals in a bonding terminal region electrically connected to said connecting terminals, said method comprising the steps of:

juxtaposing the interposer with the microelectronic element so that said connecting terminals and bonding terminals of the interposer face away from the front surface of the element; and so that said bonding terminal region is adjacent to said contacts of the microelectronic element; and connecting at least some of said contacts with at least some of said bonding terminals by a plurality of flexible leads, while supporting said bonding terminals against vertical movement to facilitate said connection, wherein in said connecting step said interposer is supported by a support structure provided between said chip and said interposer, said support structure forming a part of said interposer and remaining between said interposer and said element after said connecting step.

10. A method of forming a microelectronic assembly including an element having contacts on a front surface thereof, and an interposer having a plurality of connecting terminals in a connecting terminal region, and bonding terminals in a bonding terminal region electrically connected to said connecting terminals, said method comprising the steps of:

juxtaposing the interposer with the microelectronic element so that said connecting terminals and bonding terminals of the interposer face away from the front surface of the element; and so that said bonding terminal region is adjacent to said contacts of the microelectronic element;

connecting at least some of said contacts with at least some of said bonding terminals by a plurality of flexible leads, while supporting said bonding terminals against vertical movement to facilitate said connection, wherein in said connecting step said interposer is supported by a support structure provided between said chip and said interposer, said support structure remaining between said interposer and said element after said connecting step;

providing a liquid between said chip and said interposer; and curing said liquid to form a compliant layer, said support structure holding said interposer above said liquid during said curing step, wherein said support structure is a hollow ring enclosing an interior area, said support structure having openings extending therethrough, said liquid being introduced into said interior area through said openings.

11. The method of claim 1, wherein said interposer includes a portion adjacent said bonding terminals which is movable in a vertical direction toward said front surface of said element.

* * * * *